United States Patent
Kawasaki et al.

(10) Patent No.: US 12,325,597 B2
(45) Date of Patent: Jun. 10, 2025

(54) COMPONENT SUPPLY CONTROL SYSTEM

(71) Applicant: FUJI CORPORATION, Chiryu (JP)

(72) Inventors: Yuji Kawasaki, Nagoya (JP);
Masayoshi Moriyama, Gifu (JP);
Yusuke Yamazaki, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 135 days.

(21) Appl. No.: 18/261,951

(22) PCT Filed: Jan. 29, 2021

(86) PCT No.: PCT/JP2021/003423
§ 371 (c)(1),
(2) Date: Jul. 18, 2023

(87) PCT Pub. No.: WO2022/162918
PCT Pub. Date: Aug. 4, 2022

(65) Prior Publication Data
US 2024/0083692 A1    Mar. 14, 2024

(51) Int. Cl.
*B65G 47/14* (2006.01)
*H05K 13/02* (2006.01)
*H05K 13/08* (2006.01)

(52) U.S. Cl.
CPC .............. *B65G 47/14* (2013.01); *H05K 13/02* (2013.01); *H05K 13/081* (2018.08); *B65G 2203/0233* (2013.01); *B65G 2203/041* (2013.01)

(58) Field of Classification Search
CPC ............ B65G 47/14; B65G 2203/0233; B65G 2203/041; H05K 13/081; H05K 13/02
USPC .......................................................... 198/418
See application file for complete search history.

(56) References Cited

U.S. PATENT DOCUMENTS

| 12,207,416 B2* | 1/2025 | Kobayashi ........... H05K 13/041 |
| 2015/0245549 A1* | 8/2015 | Kurita ..................... H05K 3/32 |
| | | 228/8 |
| 2020/0170154 A1 | 5/2020 | Sugihara |

FOREIGN PATENT DOCUMENTS

| JP | 2011-114084 A | 6/2011 |
| WO | WO 2017/208325 A1 | 12/2017 |
| WO | WO 2020/178887 A1 | 10/2020 |

OTHER PUBLICATIONS

CN103249293, Ito (Year: May 2018).*
International Search Report Issued Apr. 13, 2021, in PCT/JP2021/003423, filed on Jan. 29, 2021, 2 pages.

* cited by examiner

*Primary Examiner* — Gene O Crawford
*Assistant Examiner* — Lester Rushin, III
(74) *Attorney, Agent, or Firm* — Oblon, McClelland, Maier & Neustadt, L.L.P.

(57) ABSTRACT

A component supply control system includes a state recognition section configured to derive a supply state of a component for each of multiple areas set in advance in a supply region based on image data acquired by imaging the supply region in a state in which a bulk feeder has conveyed multiple components to the supply region by vibration, and a conveyance control section configured to control a conveyance operation of the components in the bulk feeder based on the supply state for each of the multiple areas.

10 Claims, 6 Drawing Sheets

COMPONENT SUPPLY CONTROL SYSTEM

TECHNICAL FIELD

The present disclosure relates to a component supply control system.

BACKGROUND ART

A component supply control system controls component supply using a bulk feeder. The bulk feeder is installed on a component mounter that mounts components on a board, and supplies the components in a bulk state. Patent Literature 1 discloses a configuration in which vibration is applied to a conveyance path to convey multiple components. By such a conveyance operation, the bulk feeder supplies the components in a supply region that is open upward such that a suction nozzle can collect the components.

PATENT LITERATURE

Patent Literature 1: JP-A-2011-114084

BRIEF SUMMARY

Technical Problem

Such a bulk feeder is requested to supply the components from, for example, a control device of the component mounter, and executes a defined conveyance operation. However, since the components are in the bulk state in the supply region, there may be variation in the number of components that are collectable even in a case where the defined conveyance operation is executed. In a system that controls the component supply using the bulk feeder, it is demanded to maintain a satisfactory supply state of the components and improve the productivity.

The present description is to provide a component supply control system capable of making a supply state of components in a bulk feeder satisfactory and improving the productivity of a component mounter installed with the bulk feeder.

Solution to Problem

The present description discloses a component supply control system including a state recognition section configured to derive a supply state of a component for each of multiple areas set in advance in a supply region based on image data acquired by imaging the supply region in a state in which a bulk feeder has conveyed multiple components to the supply region by vibration, and a conveyance control section configured to control a conveyance operation of the components in the bulk feeder based on the supply state for each of the multiple areas.

Advantageous Effects

With such a configuration, the conveyance operation of the bulk feeder is controlled based on the supply state of the component for each of the multiple areas in the supply region. As a result, it is possible to execute the conveyance operation corresponding to the current supply state, and it is possible to increase the number of the components that are collectable in the supply region. In this manner, by making the supply state of the component in the bulk feeder satisfactory, it is possible to improve the productivity of the component mounter.

DESCRIPTION OF EMBODIMENTS

Figure 1:
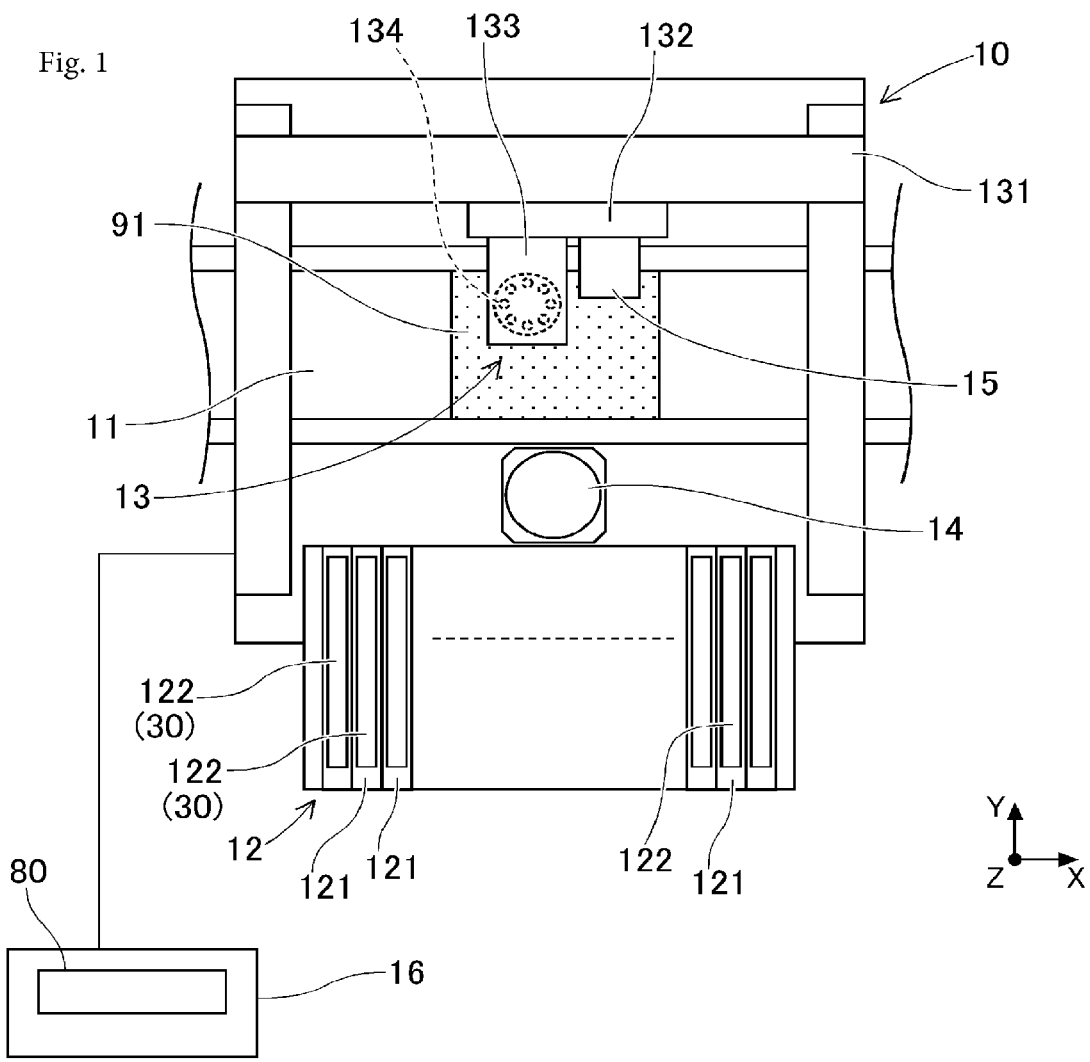
FIG. 1 is a plan view schematically showing a component mounter installed with a bulk feeder.

Component supply control system 80 that controls component supply using bulk feeder 30 will be described with reference to the drawings. Bulk feeder 30 is installed on, for example, component mounter 10 that mounts components 92 to board 91, and supplies components 92 in a bulk state (loose state in which postures of components 92 are irregular).

1. Configuration of Component Mounter 10

Component mounter 10 configures a production line for producing a board product together with multiple types of board work machines including, for example, another component mounter 10. The board work machine configuring the production line described above can include a printer, an inspection device, a reflow furnace, or the like.

1-1. Board Conveyance Device

As shown in FIG. 1, component mounter 10 includes board conveyance device 11. Board conveyance device 11 subsequently conveys board 91 in a conveyance direction, and positions board 91 at a predetermined position in the machine.

1-2. Component Supply Device 12

Component mounter 10 includes component supply device 12. Component supply device 12 supplies components to be mounted on board 91. Component supply device 12 is installed with feeder 122 in each of multiple slots 121. A tape feeder, which supplies the components to be collectable, for example, by feeding and moving a carrier tape accommodating a large number of components, is applied to feeder 122. In addition, bulk feeder 30, which supplies the components accommodated in a bulk state to be collectable, is applied to feeder 122. Details of bulk feeder 30 will be described below.

1-3. Component Transfer Device 13

Component mounter 10 includes component transfer device 13. Component transfer device 13 transfers the components supplied by component supply device 12 to a predetermined mounting position on board 91. Component transfer device 13 includes head driving device 131, moving table 132, mounting head 133, and suction nozzle 134. Head driving device 131 moves moving table 132 in a horizontal direction (X-direction and Y-direction) by a linear motion mechanism. Mounting head 133 is detachably fixed to moving table 132 by a clamp member (not shown), and is provided to be movable in the horizontal direction in the machine.

Mounting head 133 supports multiple suction nozzles 134 to be rotated, and lifted and lowered. Suction nozzle 134 is a holding member that collects and holds components 92 supplied by feeder 122. Suction nozzle 134 picks up the components supplied by feeder 122 by supplied negative pressure air. As the holding member attached to mounting head 133, a chuck or the like that holds the components by gripping the components can be adopted.

1-4. Part Camera 14 and Board Camera 15

Component mounter 10 includes part camera 14 and board camera 15. Part camera 14 and board camera 15 are digital imaging devices having imaging elements, such as a CMOS. Part camera 14 and board camera 15 execute imaging based on control signals and send image data acquired by the imaging. Part camera 14 is configured to image the components held by suction nozzle 134 from below. Board camera 15 is provided on moving table 132 to be movable in the horizontal direction integrally with mounting head 133. Board camera 15 is configured to image board 91 from above.

Figure 4:
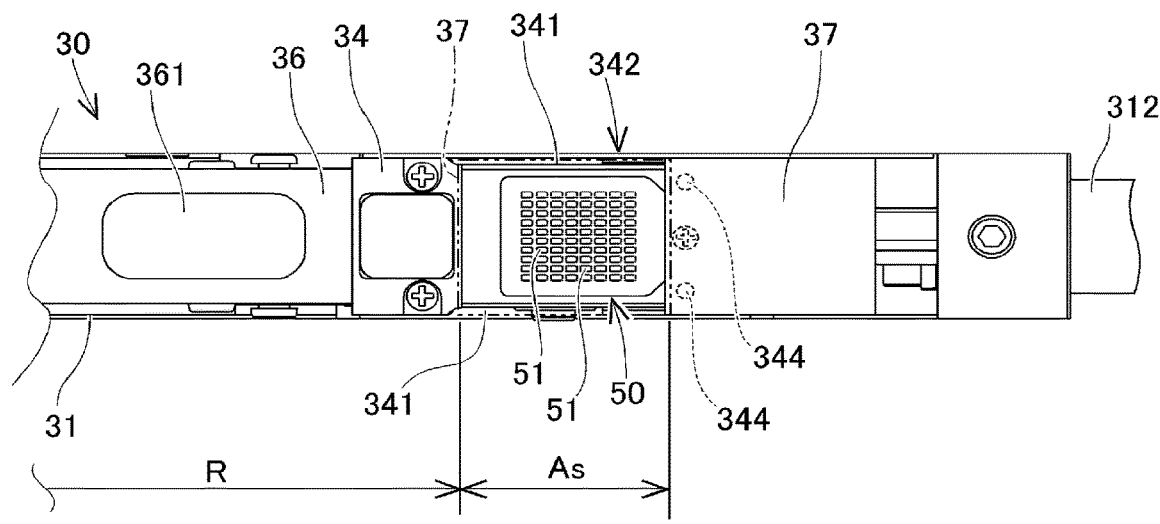
FIG. 4 is a plan view as seen from the IV direction in FIG. 2.

In addition to a surface of board 91, various devices can be imaged by board camera 15 as long as various devices are within a movable range of moving table 132. For example, in the present embodiment, as shown in FIG. 4, board camera 15 can perform imaging by including, in a camera visual field, supply region As to which bulk feeder 30 supplies components 92 or reference mark 344 provided on an upper part of bulk feeder 30. As described above, board camera 15 can be used for imaging different imaging targets to acquire the image data used for various pieces of image processing.

1-5. Control Device 16

As shown in FIG. 1, component mounter 10 includes control device 16. Control device 16 is mainly composed of CPU, various memories, a control circuit, and a storage device. Control device 16 stores various data such as a control program used for controlling a mounting process. The control program indicates the mounting position, the mounting angle, and the mounting order of the components mounted on board 91 in the mounting process.

Control device 16 executes recognition processing of a holding state of the component held by each of multiple holding members (suction nozzles 134). Specifically, control device 16 executes the image processing on the image data acquired by the imaging of part camera 14 and recognizes a position and an angle of each component with respect to a reference position of mounting head 133. In addition to part camera 14, control device 16 may execute the image processing on the image data acquired by imaging the components by a head camera unit or the like provided integrally with mounting head 133 from side, below, or above.

Control device 16 controls a mounting operation of the components by mounting head 133 based on the control program to execute the mounting process. Here, the mounting process includes a process of repeating a pick-and-place cycle (PP cycle) including a collection operation and the mounting operation multiple times. The "collection operation" described above is an operation of collecting the components supplied by component supply device 12 by suction nozzle 134.

In the present embodiment, control device 16 controls the operation of component supply device 12 including bulk feeder 30 in a case of executing the collection operation described above. The control targeted for the operation of bulk feeder 30 includes control of, for example, a supply operation of components 92 by bulk feeder 30 and an opening/closing operation of shutter 37 described below.

Control device 16 includes state recognition section 81. State recognition section 81 recognizes the supply states of multiple components 92 in supply region As of bulk feeder 30 based on the image data acquired by the imaging of the camera (in the present embodiment, board camera 15). The recognition processing of the supply state includes processing of recognizing whether there is component 92 that is collectable in supply region As, and recognizing a position and an angle of component 92 in a case where there is component 92 that is collectable. Moreover, control device 16 controls an operation of mounting head 133 in the collection operation based on a result of the recognition processing of the supply state. In the present embodiment, state recognition section 81 constitutes component supply control system 80. Details of state recognition section 81 will be described below.

In addition, the "mounting operation" described above is an operation of mounting the collected components at the predetermined mounting position on board 91 at a predetermined mounting angle. In the mounting process, control device 16 controls the operation of mounting head 133 based on information output from various sensors, the result of image processing, a control program, or the like. As a result, the positions and the angles of multiple suction nozzles 134 supported by mounting head 133 are controlled.

2. Configuration of Bulk Feeder 30

Bulk feeder 30 is installed on component mounter 10 and functions as a part of component supply device 12. Bulk feeder 30 supplies components 92 accommodated in the bulk state that are not aligned like a carrier tape. Therefore, since bulk feeder 30 does not use the carrier tape unlike the tape feeder, there is an advantage in that loading of the carrier tape, collection of the used tape, or the like can be omitted.

Bulk feeder 30 is, for example, of a type that supplies components 92 in an irregular posture to planar supply region As. However, in a case where, in supply region As, components 92 are so close to the extent that components 92 contact each other, are deposited on each other (in a state of overlapping in an up-down direction), or are in a horizontal posture in which a width direction of component 92 is in the up-down direction, component mounter 10 cannot make these components 92 as a collection target. Accordingly, in order to increase a number of collectable components 92, there is a type of bulk feeder 30 that supplies components 92 in an aligned state in supply region As. In the present embodiment, bulk feeder 30 of the type in which components 92 are aligned will be described as an example.

2-1. Feeder Main Body 31

Figure 2:
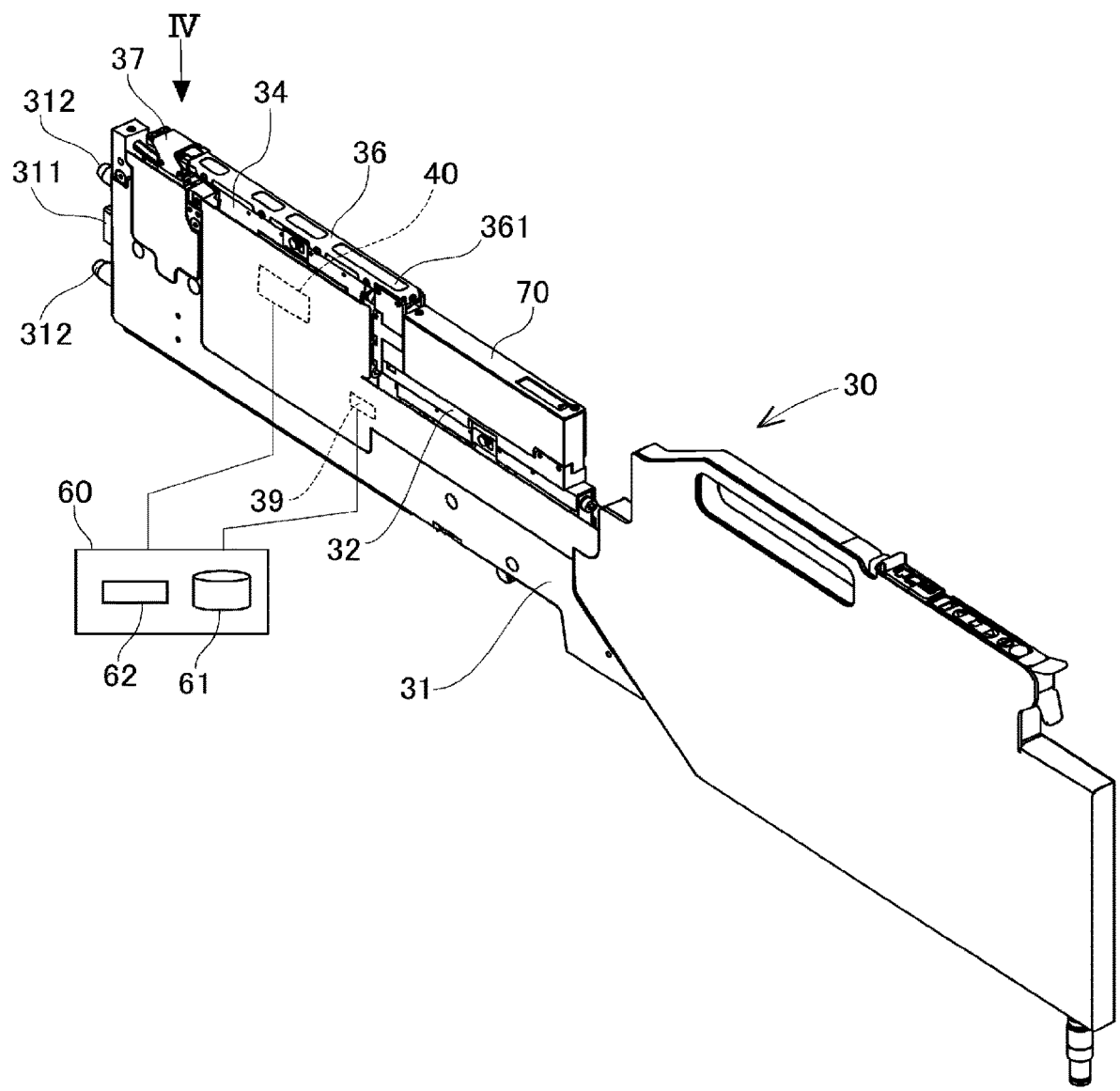
FIG. 2 is a perspective view showing an external appearance of the bulk feeder.
Figure 3:
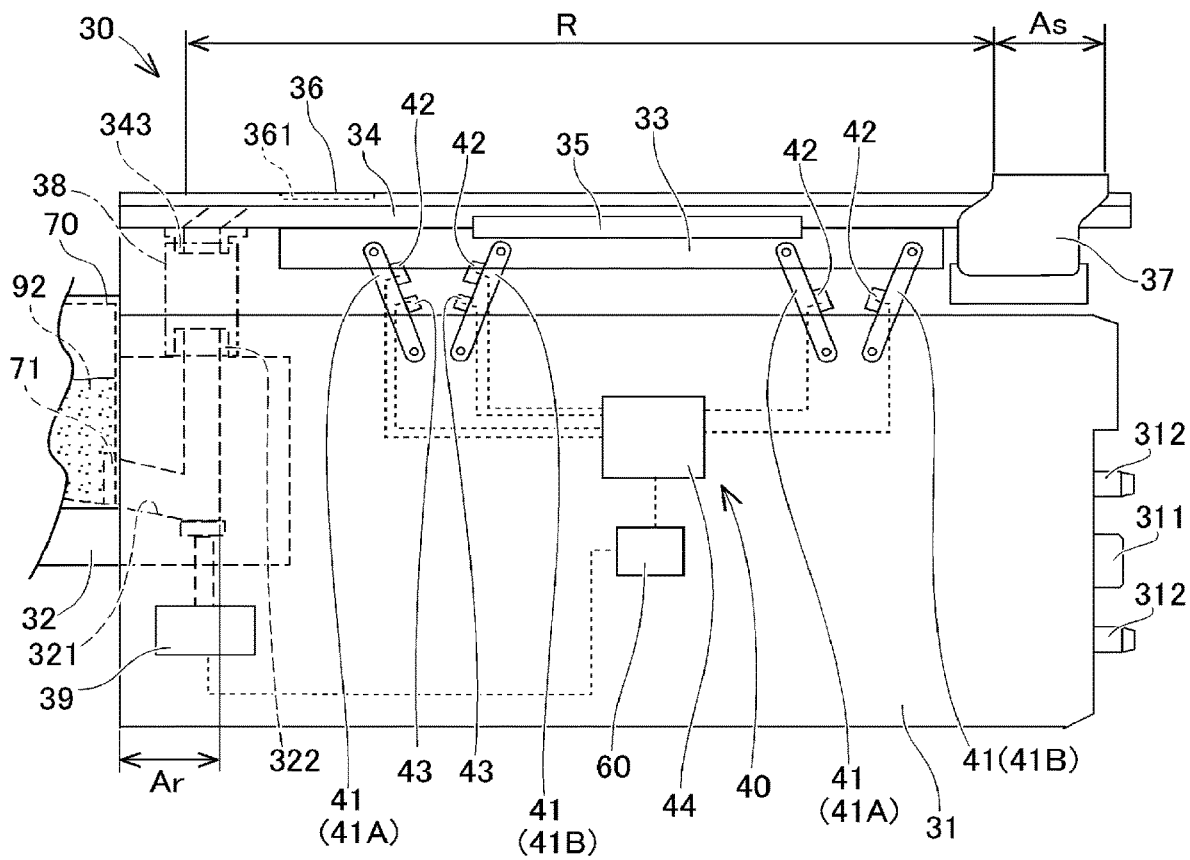
FIG. 3 is a side view schematically showing a main portion of the bulk feeder.

As shown in FIG. 2, bulk feeder 30 includes feeder main body 31 formed in a flat box shape. Connector 311 and two pins 312 are provided at a front part of feeder main body 31. In a case where feeder main body 31 is set in slot 121 of component supply device 12, feeder main body 31 is placed in a state in which power is supplied via connector 311 and communication with control device 16 is enabled. Two pins 312 are inserted into guide holes provided in slot 121, and are used for positioning in a case where feeder main body 31 is set in slot 121.

2-2. Receiving Member 32

Component case 70 that accommodates multiple components 92 in the bulk state is detachably attached to feeder main body 31 via receiving member 32. Component case 70 is an external device of bulk feeder 30. One component case 70 suitable for the mounting process is selected from various types of component cases 70 and attached to feeder main body 31. Discharge port 71 through which components 92 are discharged to the outside is formed in a front part of component case 70.

Receiving member 32 is provided to be vibratable with respect to feeder main body 31, and supports attached component case 70. Receiving member 32 is formed with reception region Ar for receiving components 92 discharged from component case 70. In the present embodiment, receiving member 32 has inclined section 321 inclined forward with respect to a horizontal plane in reception region Ar. Inclined section 321 is positioned below discharge port 71 of component case 70 and has a planar shape. Receiving member 32 is formed with a flow path of components 92 extending upward in reception region Ar, and is formed with sending section 322 through which the flow path is open upward.

2-3. Bracket 33, Track Member 34, and Lock Unit 35

Bulk feeder 30 includes bracket 33 and track member 34. Bracket 33 is provided to be vibratable with respect to feeder main body 31. Bracket 33 is formed in a block shape extending in a front-rear direction of feeder main body 31, and track member 34 is attached to an upper surface of bracket 33. Bracket 33 is supported by support member 41 of excitation device 40 described below. Track member 34 is formed with conveyance path R through which multiple components 92 are conveyed, and supply region As that communicates with conveyance path R and is open upward such that multiple components 92 are collectable.

Bulk feeder 30 includes lock unit 35. Lock unit 35 locks track member 34 in a state in which track member 34 is attached to bracket 33. In a case where track member 34 is locked by lock unit 35, track member 34 is placed in a state of vibrating integrally with bracket 33 with respect to feeder main body 31. Track member 34 is placed in a state of being detachable from bracket 33 by the unlocking of lock unit 35.

2-4. Detailed Configuration of Track Member 34, Cover 36, Shutter 37, and Connection Member 38

Track member 34 is formed to extend in a front-rear direction of feeder main body 31 (left-right direction in FIG. 4). Pair of side walls 341 protruding upward are formed on both edges of track member 34 in a width direction (the up-down direction in FIG. 4). Pair of side walls 341 surrounds the periphery of conveyance path R together with distal end portion 342 of track member 34, and prevents leakage of components 92 conveyed through conveyance path R. Circular reference mark 344 indicating a reference position of supply region As is affixed to an upper surface of distal end portion 342 in a pair in the left-right direction.

In the present embodiment, alignment member 50 is exchangeably attached to track member 34. Alignment member 50 has multiple cavities SI that individually accommodate multiple components 92. Specifically, multiple cavities 51 are arranged in a matrix in supply region As. For example, alignment member 50 has 80 cavities 51 in total in which 8 cavities are regularly arranged in the conveyance direction and 10 cavities are regularly arranged in the width direction of conveyance path R. Each of multiple cavities 51 is open upward to accommodate component 92 in a posture in which a thickness direction of component 92 is in the up-down direction.

The opening of cavity 51 is set to a size slightly larger than an outer shape of component 92 as viewed from above. A depth of cavity 51 is set in accordance with the type (shape, mass, or the like) of components 92. One track member 34 selected from various types of track members 34 based on the type of components 92, the required number of cavities 51, and the functionality is attached to track member 34.

Here, "supply region As" of track member 34 is a region for supplying components 92 in the bulk state, and is a region from which components 92 are collectable by suction nozzle 134 supported by mounting head 133. In addition, "conveyance path R" of track member 34 is a path of components 92 through which components 92 from reception region Ar to track member 34 are conveyed to supply region As.

Bulk feeder 30 includes cover 36. Cover 36 is fixed to track member 34 and covers an upper part of conveyance path R. Cover 36 has multiple exhaust ports 361 formed on an upper surface thereof. A mesh having a joint smaller than an outer dimension of component 92 is stretched over exhaust port 361. With such a configuration, cover 36 is configured to discharge air from exhaust port 361 to the outside while preventing components 92 from protruding from conveyance path R.

Bulk feeder 30 includes shutter 37 provided on an upper part of track member 34 and capable of closing the opening of supply region As. Bulk feeder 30 can prevent the protruding of components 92 or the mixing of foreign matter into supply region As by opening and closing shutter 37. In the present embodiment, shutter 37 is switched between an open state, a closed state, and an intermediate state by the opening/closing operation. The closed state of shutter 37 is a state in which shutter 37 contacts track member 34 and the opening of supply region As is completely closed. In this case, as indicated by dashed lines in FIG. 4, shutter 37 is positioned on feeder main body 31 more rearward than pair of reference marks 344 of track member 34, and pair of reference marks 344 can be visually recognized and imaged as viewed from above.

The open state of shutter 37 is a state in which the opening of supply region As is not closed and a principal range of supply region As (range in which multiple cavities 51 are provided in the present embodiment) is exposed. In this case, suction nozzle 134 can execute the collection operation of components 92 with respect to any of cavities 51. The intermediate state of shutter 37 is a state between the closed state and the open state, and is a state in which shutter 37 is separated from track member 34 by at least the amplitude of track member 34 vibrating by the excitation of excitation device 40, and prevents the protruding of components 92 from the opening of supply region As. The opening/closing operation of shutter 37 is executed by a driving device (not shown), and shutter 37 is placed in the closed state, the open state, and the intermediate state in accordance with a driving state of the driving device.

Track member 34 is formed with a flow path of components 92 extending downward at a rear part, and has introduction section 343 through which the flow path is open downward. Introduction section 343 faces sending section 322 of receiving member 32 in the up-down direction. Bulk feeder 30 includes connection member 38 having a tubular shape. Connection member 38 connects sending section 322 of receiving member 32 and introduction section 343 of track member 34. In the present embodiment, connection member 38 is a close contact coil spring and has flexibility as a whole.

With the configuration described above, connection member 38 connects reception region Ar and conveyance path R such that multiple components 92 can pass through. In addition, connection member 38 absorbs the vibration by deforming in accordance with the vibration of receiving member 32 and the vibration of track member 34 with respect to feeder main body 31. Connection member 38 reduces or blocks the vibration transmitted between receiving member 32 and track member 34 that vibrate independently of each other.

2-5. Air Supply Device 39

Bulk feeder 30 includes air supply device 39. Air supply device 39 supplies positive pressure air from below reception region Ar, and moves multiple components 92 from receiving member 32 to track member 34 via connection member 38. In the present embodiment, air supply device 39 supplies or blocks the positive pressure air supplied from the outside from below reception region Ar based on a command of feeder control device 60 described below.

In a case where air supply device 39 supplies the positive pressure air, multiple components 92 remaining in reception region Ar are blown upward by the positive pressure air. The positive pressure air and multiple components 92 pass through sending section 322 of receiving member 32, connection member 38, and introduction section 343 in this order, and reach conveyance path R of track member 34. Here, the positive pressure air is exhausted to the outside from exhaust port 361 of cover 36. In addition, multiple components 92 fall into conveyance path R of track member 34 by their own weights.

2-6. Excitation Device 40

Bulk feeder 30 includes excitation device 40 provided in feeder main body 31. Excitation device 40 applies the vibration to track member 34 such that multiple components 92 are conveyed along conveyance path R. Specifically, excitation device 40 includes multiple support members 41, multiple piezoelectric elements 42, vibration sensor 43, and power supply device 44. Multiple support members 41 directly or indirectly connect feeder main body 31 and bracket 33 to support bracket 33.

In the present embodiment, multiple support members 41 include forward movement support member 41A used for forward conveyance of components 92 and rearward movement support member 41B used for rearward conveyance. The inclination directions of forward movement support member 41A and rearward movement support member 41B with respect to the vertical direction are different from each other. Multiple piezoelectric elements 42 are vibrators that vibrate at a frequency corresponding to the power supplied from power supply device 44. Multiple piezoelectric elements 42 are attached to multiple support members 41, respectively.

In a case where at least a part of multiple piezoelectric elements 42 vibrates, the vibration is applied to track member 34 via bracket 33. In addition, the amplitude of track member 34 is changed in accordance with the voltage applied to piezoelectric element 42. Vibration sensor 43 detects a vibration value indicating a vibration state of track member 34 vibrating by the excitation of excitation device 40. As the vibration value indicating the vibration state described above, the amplitude, the frequency, the decay time, the vibration trajectory, or the like can be applied. In the present embodiment, vibration sensor 43 detects the actual frequency or amplitude of the vibration of track member 34 in a case where piezoelectric element 42 is supplied with power to vibrate.

In the present embodiment, vibration sensor 43 is provided on each of multiple support members 41 that support bracket 33 that vibrates integrally with track member 34. More specifically, piezoelectric element 42 and vibration sensor 43 are provided on each of forward movement support member 41A and rearward movement support member 41B. Vibration sensor 43 provided on forward movement support member 41A detects the actual frequency or amplitude as the vibration value in a case where piezoelectric element 42 provided on forward movement support member 41A is supplied with power and applies vibration to track member 34 via bracket 33.

Here, in a case where excitation device 40 applies the vibration to track member 34, track member 34 makes an elliptical motion in a side view. As a result, the external force of a front side and an upper side, or the external force of a rear side and an upper side is applied to multiple components 92 in conveyance path R in accordance with a rotation direction of the elliptical motion of track member 34. As a result, multiple components 92 are conveyed to the front side or conveyed the rear side of track member 34.

Power supply device 44 changes the frequency and the applied voltage of the power to be supplied to piezoelectric element 42 based on a command from feeder control device 60 described below. As a result, the frequency and the amplitude of the vibration applied to track member 34 are adjusted, so that the rotation direction of the elliptical motion of track member 34 is determined. In a case where the frequency or the amplitude of the vibration of track member 34 and the rotation direction of the elliptical motion caused by the vibration are changed, the conveyance speed of components 92 to be conveyed, the degree of dispersion of components 92, the conveyance direction, and the like are changed.

Therefore, in order to improve the conveyance efficiency, excitation device 40 sets in advance power supply (frequency and applied voltage) corresponding to the vibration characteristics (including the natural frequency) having individual differences. For example, bulk feeder 30 executes calibration processing in a state in which track member 34 used for the supply operation scheduled to be executed is attached, that is, in a state in which track member 34 is locked by lock unit 35 with respect to bracket 33. Details of the calibration processing described above will be described below.

2-7. Feeder Control Device 60

Bulk feeder 30 includes feeder control device 60. Feeder control device 60 mainly includes CPU, various memories, and a control circuit. Feeder control device 60 is supplied with power via connector 311 in a state in which bulk feeder 30 is set in slot 121, and is placed in a state capable of communicating with control device 16 of component mounter 10.

As shown in FIG. 2, feeder control device 60 includes storage section 61. Storage section 61 includes a flash memory or the like. Storage section 61 stores various data such as a program and a conveyance parameter used for controlling a component supply process. The "conveyance parameter" described above is a parameter for controlling the operation of excitation device 40 such that the vibration applied to track member 34 is appropriate in a case where components 92 is conveyed in the component supply process, and is set in advance in association with each type of components 92, for example.

Feeder control device 60 includes excitation control section 62. Excitation control section 62 controls the operation of excitation device 40, so as to execute the conveyance operation of components 92. Specifically, excitation control section 62 sends a command to power supply device 44 of excitation device 40 in a case where the conveyance operation is executed. As a result, power supply device 44 supplies predetermined power to piezoelectric element 42, so that vibration is applied to track member 34 via bracket 33. Then, components 92 on conveyance path R are conveyed by receiving the external force to move in the conveyance direction.

3. Configuration of Component Supply Control System 80

Component supply control system 80 controls the component supply using bulk feeder 30.

Figure 5:
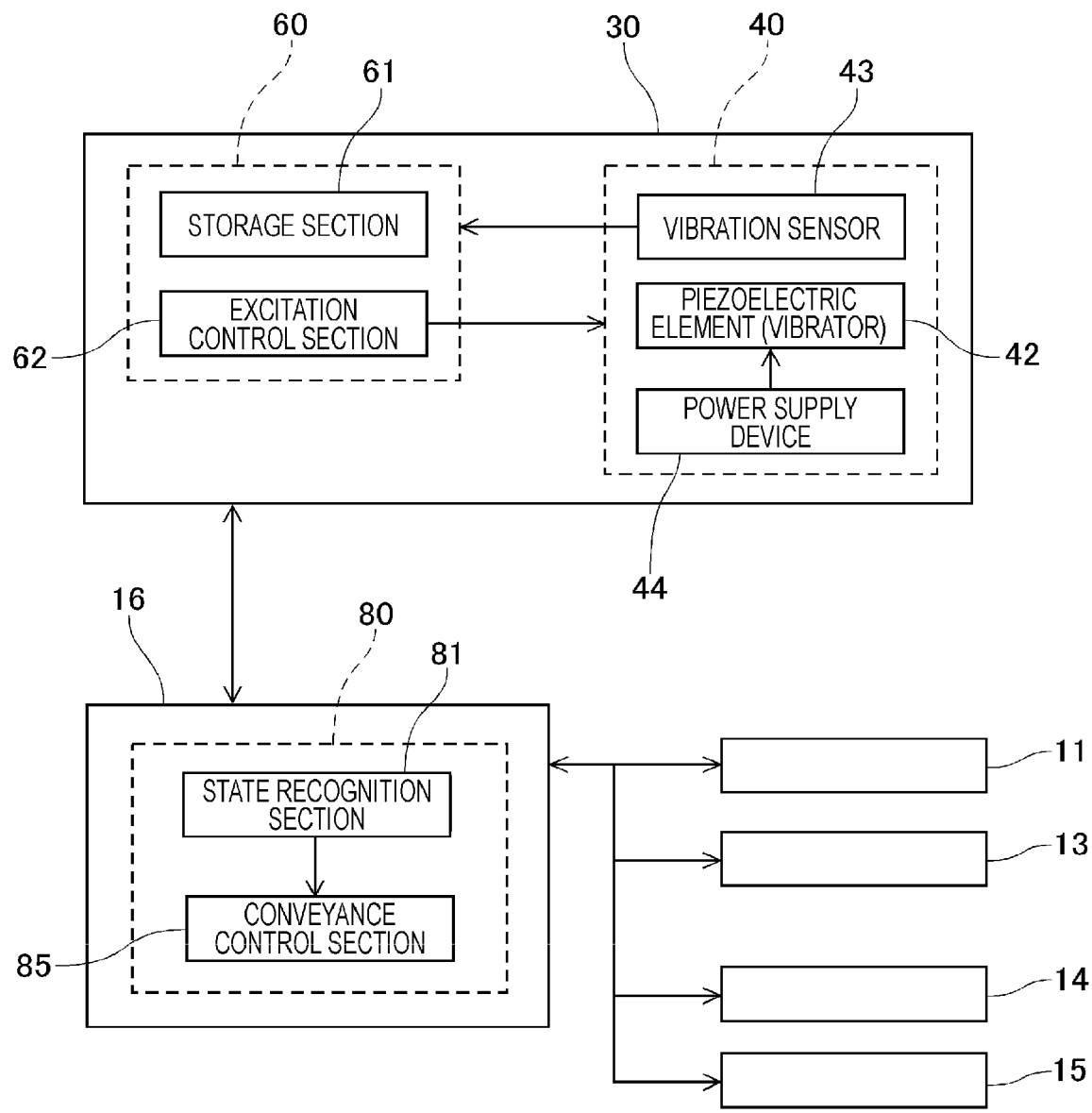
FIG. 5 is a block diagram showing the component mounter to which a component supply control system is applied.

In the present embodiment, as shown in FIG. 5, component supply control system 80 is configured to communicate with bulk feeder 30 incorporated in control device 16 and installed on slot 121. Component supply control system 80 controls the component supply in order to maintain a satisfactory supply state of components 92 in bulk feeder 30.

3-1. State Recognition Section 81

As shown in FIG. 5, component supply control system 80 includes state recognition section 81. As described above, state recognition section 81 recognizes the supply state of multiple components 92 in supply region As of bulk feeder 30 based on image data D1 (see FIG. 6) acquired by the imaging of board camera 15. More specifically, state recognition section 81 first executes the recognition processing of the supply state based on image data D1 acquired by imaging supply region As in a state in which bulk feeder 30 has conveyed multiple components 92 to supply region As by the vibration.

Figure 6:
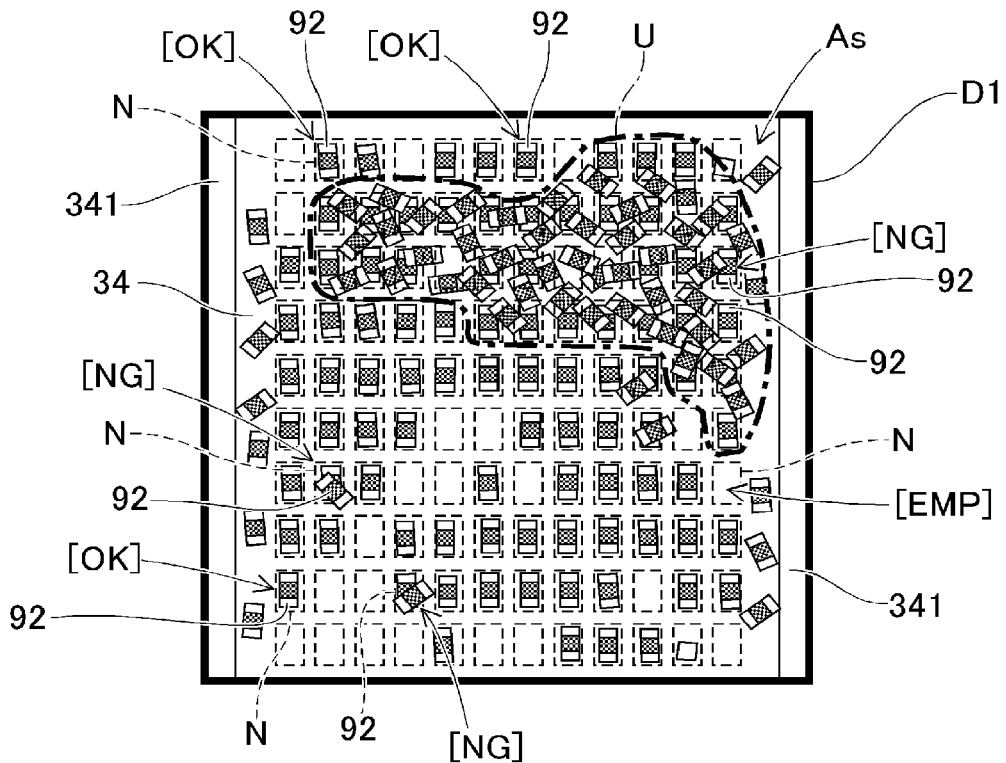
FIG. 6 is a diagram showing image data obtained by imaging a supply region.

FIG. 6 shows an example of image data D1. As described above, in supply region As, a large number of components 92 in the bulk state are present, and for example, the component accommodated in cavity 51 in a normal posture, the component outside cavity 51, the components that contact each other or deposited on each other, and the component in the horizontal posture can be present. Then, state recognition section 81 derives the supply state of component 92 for each of multiple areas N set in advance in supply region As.

That is, state recognition section 81 does not recognize the supply state as to whether each of individual components 92 recognized by the image processing is collectable, but derives whether components 92 present in area N are collectable for each of multiple areas N as the supply state. Whether component 92 belongs to area N is determined by whether a reference portion (for example, the component center) of component 92 is in area N.

In the present embodiment, the "supply state" described above includes a state in which component 92 is present in area N and is collectable, a state in which component 92 is present in area N and is not collectable, and a state in which component 92 is not present in area N. The positions, shapes, and numbers of multiple areas N can be optionally set. In the present embodiment, each of multiple areas N is set corresponding to one of cavities 51, as indicated by the dashed lines in FIG. 6.

Specifically, one area N is set to the position of corresponding cavity 51 and to have a rectangular shape, and is separated from other areas N. As a result, in a case where component 92 is accommodated in the normal posture in predetermined cavity 51 and there is no contact or deposition with other components, one components 92 is accommodated in area N corresponding to cavity 51. In this case, a longitudinal direction of area N (up-down direction in FIG. 6) substantially coincides with a longitudinal direction of component 92.

Figure 7:
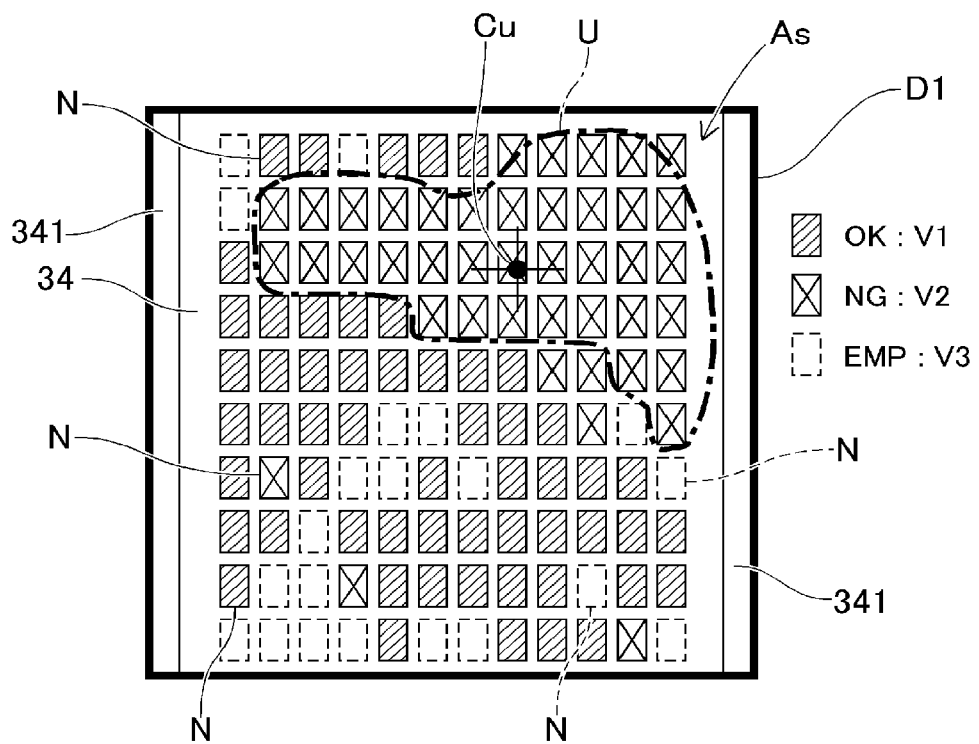
FIG. 7 is a diagram showing a result of recognition processing of a supply state for the image data in FIG. 6.

In addition, as shown in FIG. 7, state recognition section 81 derives the supply state by classifying the supply state into multiple types. FIG. 7 shows area N of the supply state ([OK]) in which component 92 is present in area N and collectable, with hatching. In addition, FIG. 7 shows area N in the supply state ([NG]) in which component 92 is present in area N and is not collectable, with an X mark connecting diagonal lines. In addition. FIG. 7 shows area N of the supply state ([EMP]) in which component 92 is not present in area N, with only an outer shape of the dashed line. As shown in FIG. 7, state recognition section 81 calculates the number (V1, V2, V3) of the respective supply states (OK, NG, EMP).

Here, as shown in FIG. 6, component group U in which multiple components 92 are densely may be formed in supply region As, for example, due to too many components 92 being conveyed for the number of cavities 51. In the present embodiment, state recognition section 81 further derives the position and the size of component group U as a component group state based on image data D1. Specifically, state recognition section 81 may recognize the state of contact and deposition of components 92 to derive the component group state.

In a case where the supply state [NG] continues for a defined number or more, state recognition section 81 may derive the component group state by assuming that a region including multiple areas N corresponds to component group U. As described above, state recognition section 81 derives position Cu and the size of component group U as the component group state as indicated by a chain lines in FIG. 7.

3-2. Conveyance Control Section 85

As shown in FIG. 5, component supply control system 80 includes conveyance control section 85. Conveyance control section 85 controls the conveyance operation of components 92 in bulk feeder 30 based on the supply state for each of multiple areas N. Here, the conveyance operation of components 92 in bulk feeder 30 includes a feed operation and a return operation. The "feed operation" described above is an operation of conveying components 92 from the rear side to the front side of track member 34, which is an operation of moving multiple components 92 forward from conveyance path R communicating with supply region As to the side of supply region As. In addition, the "return operation" is an operation of conveying components 92 from the front side to the rear side of track member 34, which is an operation of moving multiple components 92 rearward from supply region As to the side of conveyance path R.

Conveyance control section 85 controls the number of executions of the feed operation and the return operation described above, the execution time, and the like based on the supply state for each of multiple areas N. In the present embodiment, conveyance control section 85 switches between multiple conveyance patterns in the control of the conveyance operation based on the ratio (V1:V2:V3) of the supply states (OK, NG, EMP) derived by state recognition section 81 for each of multiple areas N. Various modes can be adopted for the above-described switching between the conveyance patterns. For example, conveyance control section 85 may simply adopt the conveyance patterns corresponding to the types of the supply state that is the maximum number.

In addition, conveyance control section 85 may switch between multiple conveyance patterns based on at least one of the position at which each of multiple areas N is set in supply region As and weighting set in each of multiple areas N, and the ratio of the supply states. Specifically, a higher weight may be applied to multiple areas N as to distal end portion 342 of track member 34 is closer, and the ratio of the supply states (V1:V2:V3) may be calculated. As a result, for example, the importance of cavity 51 closer to board 91 is increased, and the conveyance operation having a higher priority is executed.

Here, multiple conveyance patterns described above include normal conveyance, replenishment conveyance, and removal conveyance. The "normal conveyance" described above is a conveyance pattern that executes the feed operation and the return operation for a time period set in advance. In this normal conveyance, for example, the feed operation and the return operation may be alternately repeated two or more times. The "replenishment conveyance" described above is a conveyance pattern that increases the number of components 92 to be moved forward or the execution time of the feed operation as compared with the normal conveyance. The "removal conveyance" described above is a conveyance pattern that reduces the number of components 92 to be moved rearward or the execution time of the return operation as compared with the normal conveyance.

As an example, in a case where the supply state ([OK]) in which component 92 is present in area N and is collectable is the greatest in the ratio of the supply states (V1:V2:V3), conveyance control section 85 determines that the supply state is satisfactory, and sets [normal conveyance] as the conveyance pattern. In addition, in a case where the supply state ([NG]) in which component 92 is present in area N and is not collectable is the greatest in the ratio of the supply states (V1:V2:V3), conveyance control section 85 determines that components 92 are present excessively in supply region As, and sets [removal conveyance] as the conveyance pattern.

Further, in a case where the supply state ([EMP]) in which component 92 is not present in area N is greatest in the ratio of the supply states (V1:V2:V3), conveyance control section 85 determines that components 92 in supply region As are insufficient, and sets [replenishment conveyance] as the conveyance pattern. Here, in order to increase or reduce the number of components 92 to be conveyed in the replenishment conveyance or the removal conveyance as compared with the normal conveyance, for example, a method of grasping the number of components 92 to be conveyed in real time and executing control based on the same may be adopted.

Alternatively, instead of the method described above, in a case where the normal conveyance is switched to the replenishment conveyance or the removal conveyance, conveyance control section 85 may change the number of executions or the execution time of the feed operation or the return operation. Specifically, it is assumed that conveyance control section 85 executes each of the feed operation and the return operation once for the same time period in the normal conveyance. Then, in a case of switching from the normal conveyance to the replenishment conveyance, conveyance control section 85 may increase the execution time of the feed operation as compared with the return operation, and may execute each of the feed operation and the return operation twice.

Alternatively, in a case of switching from the normal conveyance to the replenishment conveyance, conveyance control section 85 may increase only the number of executions of the feed operation without changing the execution time of the return operation and the feed operation. This configuration is also applied to a case where the normal conveyance is switched to the removal conveyance by conveyance control section 85. That is, the execution time of the return operation may be increased as compared with the feed operation, or the number of executions of the return operation may be increased.

In addition, conveyance control section 85 may change the frequency or the amplitude of the vibration applied to track member 34 on which supply region As is formed, in a case in which the normal conveyance is switched to the replenishment conveyance or the removal conveyance. As a result, the vibration different from the normal conveyance is applied to track member 34, so that the magnitude and the direction of the external force applied from track member 34 to components 92 can be changed. As a result, component group U can be dispersed, or components 92 fitted into cavities 51 in an inappropriate posture can be removed.

Here, conveyance control section 85 may control the conveyance operation based on the component group state indicating the position and the size of component group U, in addition to the supply state for each of multiple areas N. The "component group state" described above includes the presence or absence and the number of component groups U. Conveyance control section 85 acquires the component group state from the result of the recognition processing by state recognition section 81. Then, as shown in FIG. 6, for example, in a case where component group U is positioned on the side of distal end portion 342 of track member 34 in supply region As, conveyance control section 85 executes the return operation such that component group U is moved more rearward than supply region As.

In addition, in a case where component group U is present and the number (V3) of empty cavities 51 (type of supply state=EMP) is equal to or larger than a predetermined number, conveyance control section 85 repeatedly executes the feed operation and the return operation to reciprocate component group U in the front-rear direction in supply region As. As a result, it is possible to attempt to accommodate component 92 in the empty cavity 51.

4. Feeder Control by Component Supply Control System 80

Component supply control system 80 executes feeder control in accordance with the supply state of bulk feeder 30 during the execution of the mounting process by component mounter 10. The feeder control described above includes control of the conveyance operation and control of the opening/closing operation of shutter 37. Here, after bulk feeder 30 is set in slot 121, control device 16 of component mounter 10 executes the calibration processing to recognize the position of supply region As in the machine.

Specifically, control device 16 first commands feeder control device 60 to close shutter 37. As a result, multiple reference marks 344 are placed in a state capable of being imaged from above. Control device 16 moves board camera 15 above multiple reference marks 344 of bulk feeder 30, and acquires the image data by imaging of board camera 15. Then, control device 16 recognizes the position of bulk feeder 30 in the machine, that is, the position of supply region As, based on the positions of multiple reference marks 344 in the image data by the image processing and the position of board camera 15 in a case where the imaging is executed.

Subsequently, conveyance control section 85 commands bulk feeder 30 to convey components 92 before components 92 are collected from bulk feeder 30 in the mounting process. As a result, bulk feeder 30 discharges components 92 from component case 70 as required, and moves components 92 to track member 34. Thereafter, bulk feeder 30 maintains shutter 37 in the intermediate state to execute the conveyance operation of components 92. As a result, components 92 are accommodated in multiple cavities 51, and excess components 92 are retracted from supply region As to the side of conveyance path R.

Figure 8:
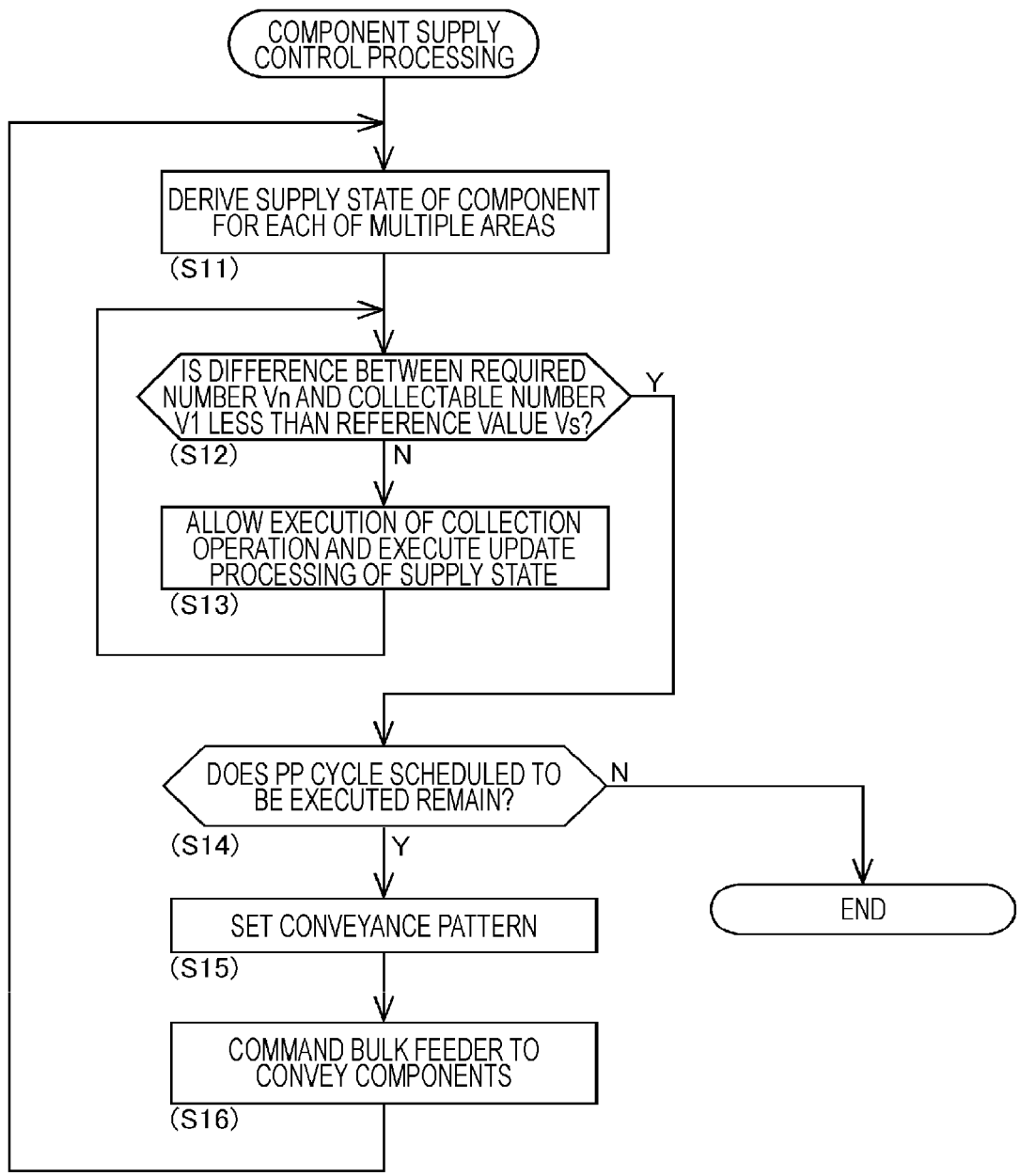
FIG. 8 is a flowchart showing component supply control processing.

Details of the component supply control processing as described above will be described with reference to FIG. 8. In the recognition processing of the supply state, state recognition section 81 commands bulk feeder 30 to open shutter 37. State recognition section 81 moves board camera 15 above supply region As, and acquires the image data by imaging of board camera 15. Then, as shown in FIG. 8, state recognition section 81 derives the supply state of component 92 for each of multiple areas N by the image processing targeting image data D1 (S11).

State recognition section 81 determines whether a difference (V1−Vn) between a required number (Vn) of components 92 to be collected from supply region As by the series of collection operations in one PP cycle and a collectable number (V1) calculated based on the supply state for each of multiple areas N is smaller than a reference value (Vs) (S12). The reference value (Vs) described above is set to a number equal to or larger than 0. In a case where the collectable number is larger than the required number and the above-described difference is equal to or larger than the reference value (S12: No, V1−Vn≥Vs), state recognition section 81 allows execution of the collection operation in the PP cycle (S13). Control device 16 executes the collection operation in the PP cycle, and then executes the mounting operation.

State recognition section 81 executes update processing of the supply state recognized in S11 (S13). In the update processing of the supply state, area N corresponding to component 92 collected by the collection operation is set to the supply state ([EMP]) in which component 92 is not present. In addition, in the update processing of the supply state, the collection number (required number Vn described above) is subtracted from the collectable number (V1) to obtain current collectable number (V1′=V1−Vn). In addition, in the update processing of the supply state, the collection number (required number Vn described above) is added to the number (V3) of empty cavities 51 to obtain the number of current empty cavities 51 (V3′=V3+Vn).

After the execution of the update processing of the supply state (S13), state recognition section 81 executes the determination processing of S12 again in order to determine whether the difference between the number of components 92 scheduled to be collected in the collection operation of the next PP cycle (next required number) and the number of remaining components 92 that are collectable in supply region As (current collectable number) is equal to or larger than the reference value (Vs). In S12, in a case where the collectable number is insufficient, the difference (V1−Vn) is smaller than the reference value (Vs)(S12: Yes, V1−Vn<Vs), and the PP cycle scheduled to be executed remains (S14: Yes), state recognition section 81 does not allow the execution of the collection operation in the PP cycle, and executes the conveyance operation by bulk feeder 30 before the collection operation is executed.

In the determination processing of S12, the difference between the collectable number and the required number is compared with the reference value, but the ratio of the collectable number to the required number may be compared with the reference value. As described above, after the update processing of the supply state (S13) is executed, or in a case where the collectable number is insufficient (S12: Yes), conveyance control section 85 sets the conveyance pattern based on the ratio of the supply state for each of current multiple areas N (S15). In a case where the difference between the number of components 92 scheduled to be collected in the collection operation of the second PP cycle (required number) and the number of remaining components 92 that are collectable in supply region As (collectable number) is equal to or larger than the reference value (Vs), state recognition section 81 omits the setting of the conveyance pattern (S15) and the like, and allows the execution of the collection operation.

Conveyance control section 85 sets multiple conveyance patterns in the control of the conveyance operation based on the ratio (V1:V2:V3) of the current supply state (OK, NG, EMP) derived for each of multiple areas N (S15). As a result, the conveyance patterns (for example, normal conveyance, replenishment conveyance, and removal conveyance) are switched. Conveyance control section 85 commands bulk feeder 30 to convey components 92 in the set conveyance pattern (S16). Bulk feeder 30 executes the conveyance operation of the set conveyance pattern in a case where the command to convey components 92 is made.

In this manner, bulk feeder 30 executes the conveyance operation in accordance with the supply state for each of multiple areas N. As a result, the normal conveyance is executed in a state in which components 92 are satisfactorily supplied by the initial setting, whereas the replenishment conveyance is executed in a case where the number of components 92 that are collectable immediately after the conveyance operation is relatively small. In this replenishment conveyance, at the same time, processing of discharging components 92 from component case 70 and moving multiple components 92 to conveyance path R may be executed in response to the command from conveyance control section 85.

In addition, in a case where the current supply state for each of multiple areas N indicates excess replenishment of components 92 or in a case where component group U is present, the removal conveyance is executed. As a result, the number of components 92 in supply region As is appropriately adjusted. Such a conveyance operation promotes components 92 to be accommodated in cavities 51 in an appropriate posture, so that the number of components 92 that are collectable in supply region As can be increased. In this manner, by making the supply state of components 92 in bulk feeder 30 satisfactory, it is possible to improve the productivity of component mounter 10.

After the conveyance operation of components 92 by bulk feeder 30 is terminated, state recognition section 81 executes the processing of deriving the supply state (S11) again. As a result, the current supply state of each of multiple areas N after the conveyance operation is recognized. In a case where all the PP cycles scheduled to be executed are terminated and the supply of components 92 is no longer required (S14: No), the component supply control system terminates the control processing described above.

5. Modification Aspect of Embodiment

5-1. Component Supply Control System 80

In the embodiment, the configuration is described as an example in which state recognition section 81 and conveyance control section 85 of component supply control system 80 are incorporated in control device 16 of component mounter 10. On the other hand, a configuration may be adopted in which one or both of state recognition section 81 and conveyance control section 85 are incorporated in an external device of control device 16. For example, a configuration may be adopted in which state recognition section 81 is integrally movably provided on moving table 132 and is incorporated in an imaging unit that controls the imaging operation of board camera 15.

In addition, conveyance control section 85 may be incorporated in component supply device 12 that mediates communication between feeders 122 installed on multiple slots 121 and control device 16. In addition, state recognition section 81 and conveyance control section 85 may be incorporated in feeder control device 60 of bulk feeder 30 as a self-control function of bulk feeder 30. In addition, state recognition section 81 and conveyance control section 85 may be incorporated in a host computer or a dedicated device that is communicably connected to component mounter 10. All aspects exhibit the same effects as those of the embodiment.

5-2. Track Member 34

In the embodiment, the configuration is adopted in which track member 34 of bulk feeder 30 includes alignment member 50 formed with multiple cavities 51. On the other hand, a configuration may be adopted in which alignment member 50 is omitted. That is, supply region As of track member 34 may be formed with a recessed portion in which components 92 are dispersed at a position lower than the upper surface of conveyance path R or a flat portion uniform with the upper surface of conveyance path R, and components 92 may be supplied in the bulk state.

In such a configuration, multiple areas N in supply region As are set to be, for example, about the outer dimensions of components 92, which are supply targets, and not to overlap with each other. Whether multiple areas N are adjacent to each other or separated as described as an example in the embodiment can be optionally set. In such an aspect, state recognition section 81 derives the supply state of component 92 for each of multiple areas N, similarly to the embodiment. Conveyance control section 85 can control the conveyance operation based on the supply state for each of multiple areas N.

It should be noted that, in the aspect described above, since components 92 are not aligned with respect to multiple areas N, the processing load of the determination as to whether components 92 are collectable and the image processing of acquiring the postures of components 92 can be relatively high. Therefore, from the viewpoint of improving the efficiency of the component supply process and reducing the load of the image processing in the recognition processing of the supply state in supply region As, the configuration described as an example in the embodiment is preferable.

5-3. Camera

In the embodiment, the configuration is adopted in which the camera that images supply region As of bulk feeder 30 is board camera 15. On the other hand, the camera that images supply region As may be a fixed camera provided above bulk feeder 30. The fixed camera described above may be dedicated to imaging of supply region As or may be used for another purpose.

Alternatively, the camera that images supply region As may be a built-in camera of bulk feeder 30 provided below supply region As. In this aspect, supply region As of track member 34 and alignment member 50 are formed of a transparent material. The built-in camera of bulk feeder 30 can image components 92 accommodated in cavities 51 by transmitting through the supply region As of track member 34 and alignment member 50. With such a configuration with the fixed camera and the built-in camera, since supply region As can be imaged at any timing regardless of the position of moving table 132, it is possible to execute the imaging processing, state recognition processing, or the like during the execution of the mounting operation. It should be noted that the aspect described as an example in the present embodiment is preferable from the viewpoint of reducing the facility cost.

REFERENCE SIGNS LIST

10: component mounter, 12: component supply device, 13: component transfer device, 15: board camera, 16: control device, 30: bulk feeder, 31: feeder main body, 34: track member, 40: excitation device, 41: support member, 41A: forward movement support member, 41B: rearward movement support member, 42: piezoelectric element (vibrator), 43: vibration sensor, 44: power supply device, 50: alignment member, 51: cavity, 60: feeder control device, 80: component supply control system, 81: state recognition section, 85: conveyance control section. 91: board, 92: component, As: supply region, R: conveyance path, N: area. U: component group, D1: image data

The invention claimed is:

1. A component supply control system comprising:
    a state recognition section configured to derive a supply state of a component for each of multiple areas set in advance in a supply region based on image data acquired by imaging the supply region in a state in which a bulk feeder has conveyed multiple components to the supply region by vibration; and
    a conveyance control section configured to control a conveyance operation of the components in the bulk feeder based on the supply state for each of the multiple areas.

2. The component supply control system according to claim 1,
    wherein the supply state includes a state in which the component is present in the area and is collectable, a state in which the component is present in the area and is not collectable, and a state in which the component is not present in the area.

3. The component supply control system according to claim 1,
    wherein the bulk feeder has multiple cavities configured to accommodate the components in the supply region, and
    each of the multiple areas is set corresponding to one of the cavities.

4. The component supply control system according to claim 1,
    wherein the state recognition section is configured to derive the supply state by classifying the supply state into multiple types, and
    the conveyance control section is configured to switch between multiple conveyance patterns in the control of the conveyance operation based on a ratio of the supply states derived for each of the multiple areas.

5. The component supply control system according to claim 4,
wherein the conveyance control section is configured to switch the multiple conveyance patterns based on at least one of a position at which each of the multiple areas is set in the supply region and weighting set in each of the multiple areas, and the ratio of the supply states.

6. The component supply control system according to claim 1,
wherein the conveyance control section is configured to switch between multiple conveyance patterns in the control of the conveyance operation, and
the multiple conveyance patterns include normal conveyance for executing a feed operation of moving the multiple components forward from a conveyance path communicating with the supply region and a return operation of moving the multiple components rearward from the supply region, replenishment conveyance for increasing the number of the components to be moved forward or an execution time of the feed operation as compared with the normal conveyance, and removal conveyance for reducing the number of the components to be moved rearward or an execution time of the return operation as compared with the normal conveyance.

7. The component supply control system according to claim 6,
wherein the conveyance control section is configured to change the number of executions or the execution time of the feed operation or the return operation, in a case where the normal conveyance is switched to the replenishment conveyance or the removal conveyance.

8. The component supply control system according to claim 6,
wherein the conveyance control section is configured to change a frequency or amplitude of vibration to be applied to a member formed with the supply region, in a case where the normal conveyance is switched to the replenishment conveyance or the removal conveyance.

9. The component supply control system according to claim 1,
wherein the state recognition section is configured to further derive a position and a size of a component group in which the multiple components are densely in the supply region, based on the image data, as a component group state, and
the conveyance control section is configured to control the conveyance operation based on the supply state for each of the multiple areas and the component group state.

10. The component supply control system according to claim 1,
wherein the conveyance control section is configured to execute the conveyance operation before a series of collection operations are executed, in a case where a difference between a required number of the components to be collected from the supply region by the series of collection operations and a collectable number calculated based on the supply state for each of the multiple areas is smaller than a reference value or in a case where a ratio of the collectable number to the required number is smaller than a reference value.

* * * * *